United States Patent [19]
Yamamoto et al.

[11] Patent Number: 5,561,408
[45] Date of Patent: Oct. 1, 1996

[54] SAW RESONATOR BANDPASS FILTER WITH ASYMETRIC APODIZED TRANSDUCERS TO SUPPRESS A SPURIOUS RESPONSE

[75] Inventors: Yasushi Yamamoto; Ryuuji Kajihara, both of Tokyo, Japan

[73] Assignee: NEC Corporation, Tokyo, Japan

[21] Appl. No.: 246,212

[22] Filed: May 19, 1994

[30] Foreign Application Priority Data

May 19, 1993 [JP] Japan ..................... 5-139956

[51] Int. Cl.⁶ .................. H03H 9/64; H03H 9/25
[52] U.S. Cl. ............. 333/194; 310/313 C; 333/196
[58] Field of Search .................. 333/193, 194, 333/195, 196; 310/313 R, 313 B, 313 C, 313 D

[56] References Cited

U.S. PATENT DOCUMENTS

| | | | |
|---|---|---|---|
| 3,633,132 | 1/1972 | Hartemann | 310/313 R X |
| 4,703,290 | 10/1987 | Zibis et al. | 333/195 |

FOREIGN PATENT DOCUMENTS

| | | | |
|---|---|---|---|
| 61-281612 | 12/1986 | Japan | 333/194 |
| 18710 | 1/1989 | Japan | |
| 3-165113 | 7/1991 | Japan | |
| 4-207618 | 7/1992 | Japan | |
| 5-55871 | 3/1993 | Japan | 333/193 |

OTHER PUBLICATIONS

Haydl et al., "Multimode SAW Resonators—A Method to Study the Optimum Resonator Design," Ultrasonics Symposium Proceedings, 1976. pp. 287–296.

Primary Examiner—Benny Lee
Assistant Examiner—Justin P. Bettendorf
Attorney, Agent, or Firm—Sughrue, Mion, Zinn, Macpeak & Seas

[57] ABSTRACT

In order to effectively suppress a spurious response appearing at a lower side of a passband of a two-pole type bandpass filter, an overlapped electrode portion of each of interdigital transducers is configured so as to reduce an influence of one standing wave resulting one of three longitudinal resonance modes.

4 Claims, 5 Drawing Sheets

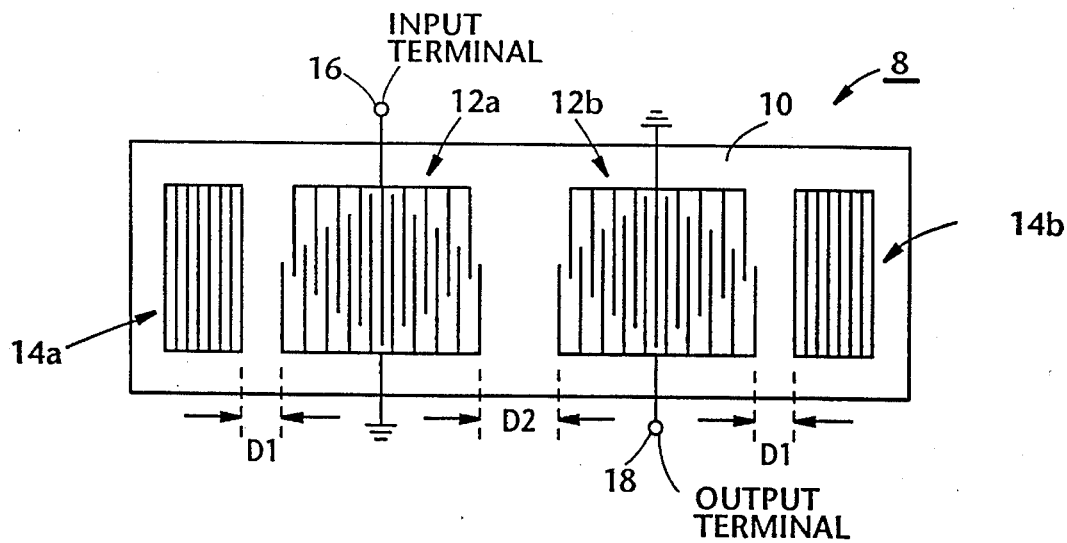
FIG. 1(a)
(PRIOR ART)
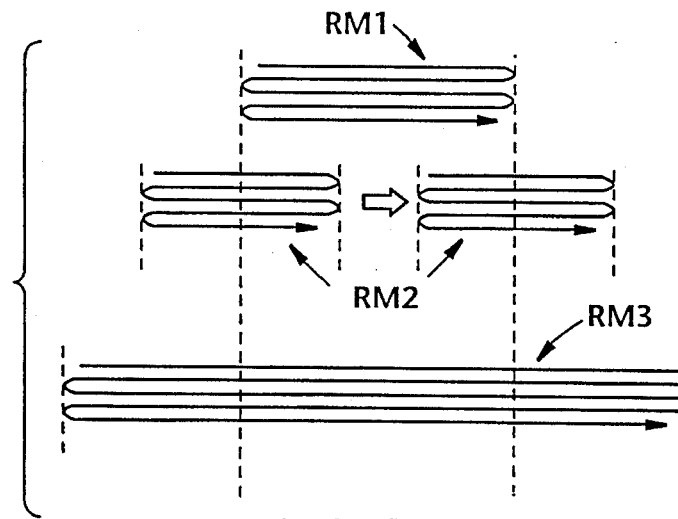
FIG. 1(b)
(PRIOR ART)
FIG. 2
(PRIOR ART)
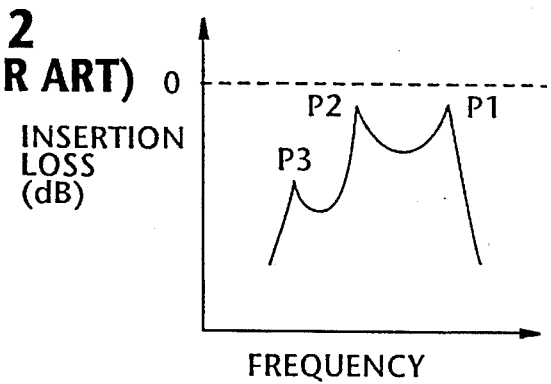

SAW RESONATOR BANDPASS FILTER WITH ASYMETRIC APODIZED TRANSDUCERS TO SUPPRESS A SPURIOUS RESPONSE

BACKGROUND OF THE INVENTION

1. Field of the Invention

The present invention relates generally to a surface acoustic wave (SAW) filter utilizing longitudinal double-mode resonances, and more specifically to such a SAW resonator filter which is capable of effectively suppressing a spurious response at a lower side of the filter's passband.

2. Description of Related Art

It is well known in the art that SAW resonator filters have been widely used in telecommunication equipment wherein narrow passband and low insertion loss are required.

Before turning to the present invention it is deemed preferable to discuss, with reference to FIGS. 1-4, a conventional SAW resonator bandpass filter using longitudinal double-mode resonances.

FIG. 1 schematically illustrates a relevant SAW resonator filter and three longitudinal resonance modes excited in the above filter in parts (a) and (b), respectively.

As shown in FIG. 1, a SAW resonator filter, depicted by numeral 8, includes a piezoelectric substrate 10 which carries thereon a pair of so-called apodized interdigital transducers (IDTs) 12a-12b and two grating reflectors 14a and 14b. These elements 12a-12b and 14a-14b are arranged in a longitudinal direction of the substrate 10 (viz., an acoustic wave propagating direction).

As shown, each of the IDTs 12a-12b is provided with a plurality of overlapped electrode pairs which are arranged in a symmetrical manner at both sides of a transversal center line of the element.

Although not clearly illustrated in the figure, each of the IDTs 12a-12b has few hundreds of electrode pairs, while each of the reflectors 14a-14b has about one hundred electrodes in parallel, merely byway of example.

The SAW resonator filter shown in FIG. 1 receives an input signal at the IDT 12a via an input terminal 16 and outputs a filtered signal from the IDT 12b via an output terminal 18.

When an input signal is applied to the SAW filter 8, three longitudinal resonance modes RM1-RM3 are excited which are schematically shown in part (b) of FIG. 1. The first resonance mode RM1 is established due to multireflections of acoustic waves between the IDTs 12a-12b. The second resonance mode RM2 is induced within the IDTs 12a and 12b. On the other hand, the third resonance mode RM3 is excited due to multiple reflections of acoustic waves between the reflectors 14a-14b.

The existence of the above mentioned longitudinal resonance modes has been discussed in a paper entitled "Composite Longitudinal Mode Resonator Type SAW Filters" by Yasushi YAMAMOTO, the Japanese Electronics, Information and Telecommunications Association, A Vol. J76-A No. 2, pages 219-226, published February 1993.

If the device shown in FIG. 1 is to operate as a two-pole bandpass filter, the longitudinal resonance modes RM1 and RM2 are utilized by appropriately determining distances D1 and D2 shown in FIG. 1.

FIG. 2 is a sketch schematically showing frequency-loss characteristics of the device shown in FIG. 1. Three peaks, depicted by P1, P2 and P3, correspond to the aforesaid three longitudinal mode resonances RM1, RM2, and RM3, respectively.

The peak P3 appearing at the low side outside of a passband generally defined by the peaks P1 and P2, is a spurious response and thus should be suppressed in order to obtain a sharp lower cut-off response. However, with the device shown in FIG. 1, it has been difficult to effectively suppress the spurious response. The reason for this will be discussed with reference to FIG. 3.

FIG. 3 shows, in part (a), the device already shown in FIG. 1. FIG. 3 further shows three standing waves SW1-SW3 in part (b), and curves 20a and 20b in part (c). These curves 20a and 20b schematically show "receive signal distribution" excited in the IDTs 12a and 12b. It should be noted that the curves 20a and 20b resemble the envelopes of the electrode overlap portions of the IDTs 12a and 12b, respectively.

The standing wave SW1, which is induced by the longitudinal resonance mode RM1, distributes over a cavity length La defined by the outer end of each of the IDTs 12a and 12b. Secondly, the standing wave SW2 is developed when the longitudinal resonance mode RM2 is excited. This standing wave SW2 distributes over a cavity length Lb defined by the inner end of each of the reflectors 14a and 14b. Lastly, the third standing wave SW3 is caused by multiple reflections of acoustic waves between the two reflectors 14a and 14b (viz., the resonance mode RM3) and distributes over a cavity length Lc specified by portions within the reflectors 14a and 14b.

As shown in part (c) of FIG. 3, each maximum of the curves 20a and 20b is shifted inward by n distance "m" as compared with the zero crossing point of the standing wave SW3. Accordingly, the above mentioned "receive signal distribution" is unable to effectively cancel the standing wave SW3. This is the reason why the undesirable spurious peak P3 is not sufficiently suppressed. It should be noted that this mechanism or principles was discovered by the inventors.

SUMMARY OF THE INVENTION

It is an object of the present invention to provide a SAW resonator bandpass filter which is capable of effectively suppressing a spurious response existing at a low frequency side of a passband.

In brief, the object is fulfilled by a technique wherein in order to effectively suppress a spurious response appearing at a lower side of a passband of a two-pole type bandpass filter, an overlapped electrode portion of each of interdigital transducers is configured so as to reduce an influence of one standing wave resulting one of three longitudinal resonance modes.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 1 is an illustration showing a SAW resonator bandpass filter and the three longitudinal resonance modes, having referred to in the opening paragraphs of the instant disclosure;

FIG. 2 is a graph schematically showing frequency-loss characteristics of the filter shown in FIG. 1;

DETAILED DESCRIPTION OF PREFERRED EMBODIMENTS

As mentioned above, the inventors have discovered the mechanism or principles for achieving effective suppression of the spurious peak P3 (FIG. 2) which undesirably appears in the frequency response of a so-called two-pole SAW resonator bandpass filter. The present invention is primarily based on the principles in question.

Figure 3A:
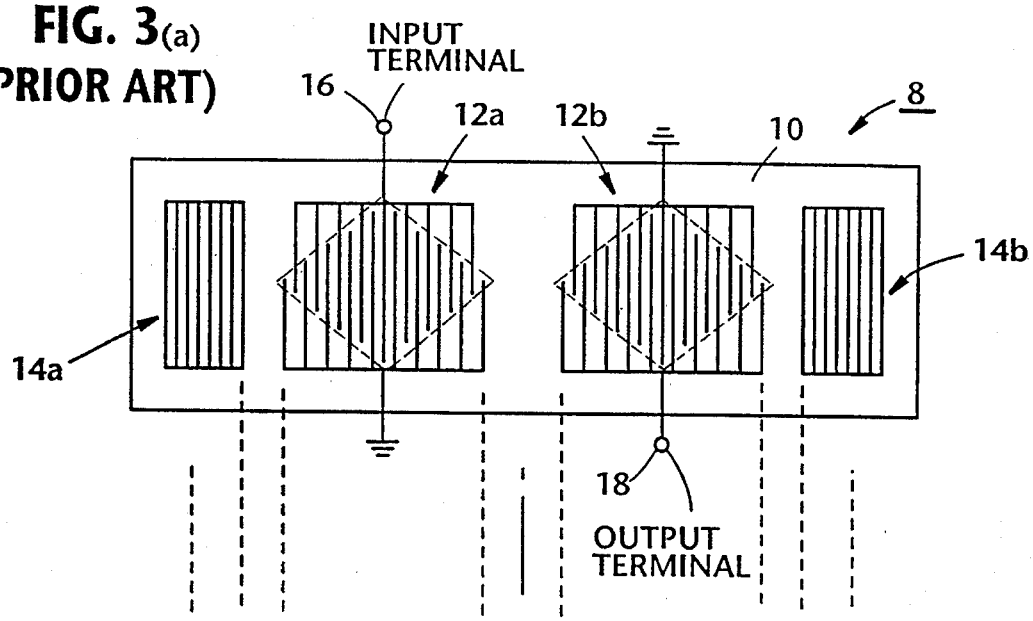
FIG. 3 is a diagram showing a SAW resonator bandpass filter and the standing waves and the receive signal distribution curves, having referred to in the opening paragraphs of the instant disclosure.
Figure 3B:
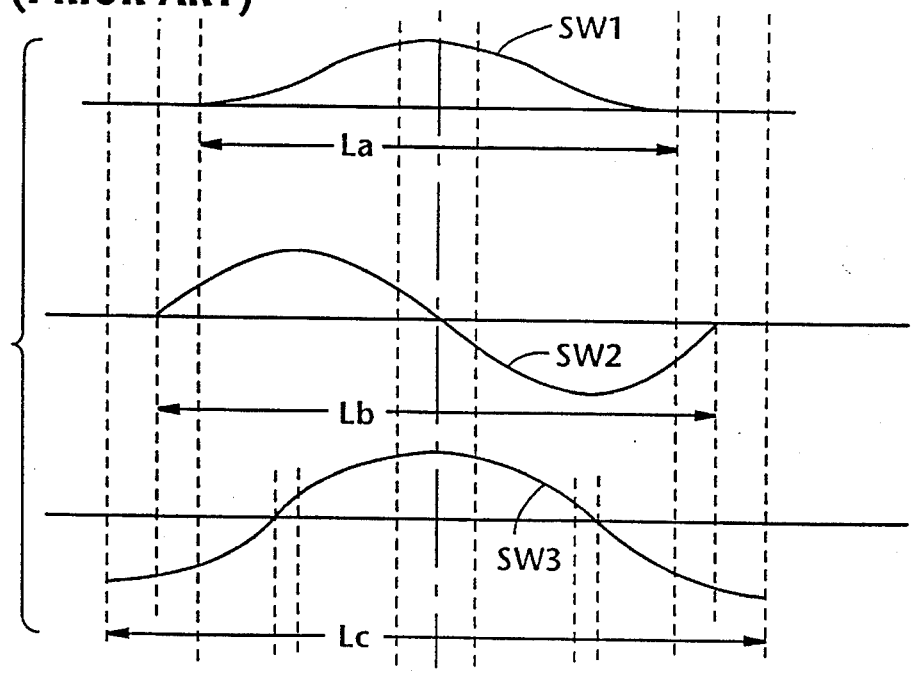
Figure 3C:
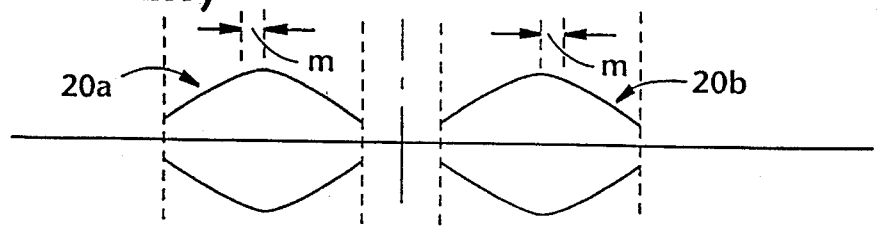
Figure 4:
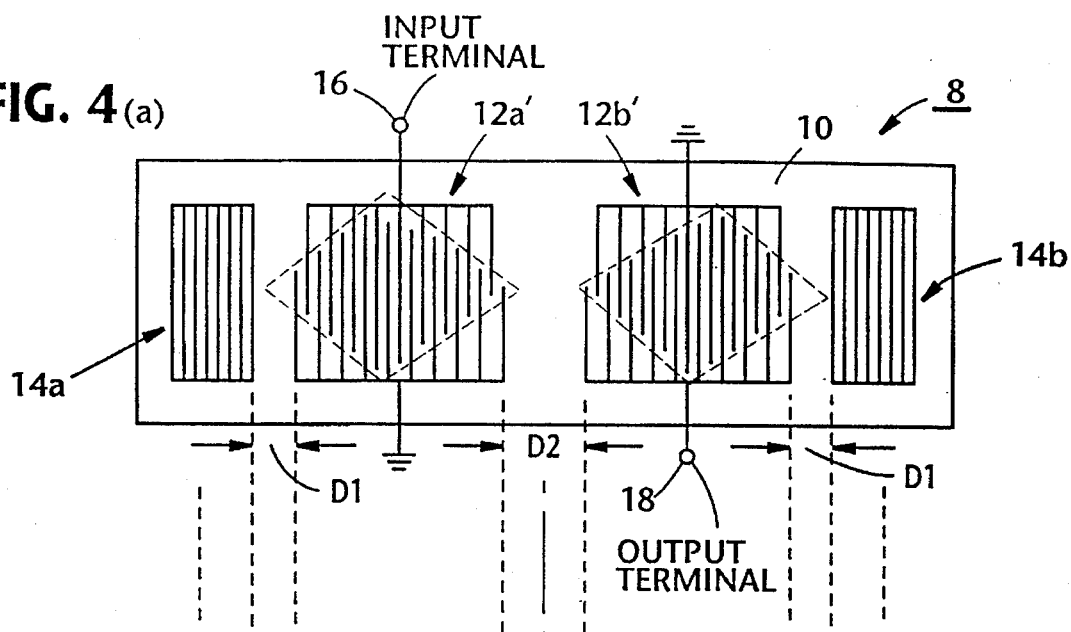
FIG. 4 is a diagram showing the principles of the instant invention.
Figure 4:
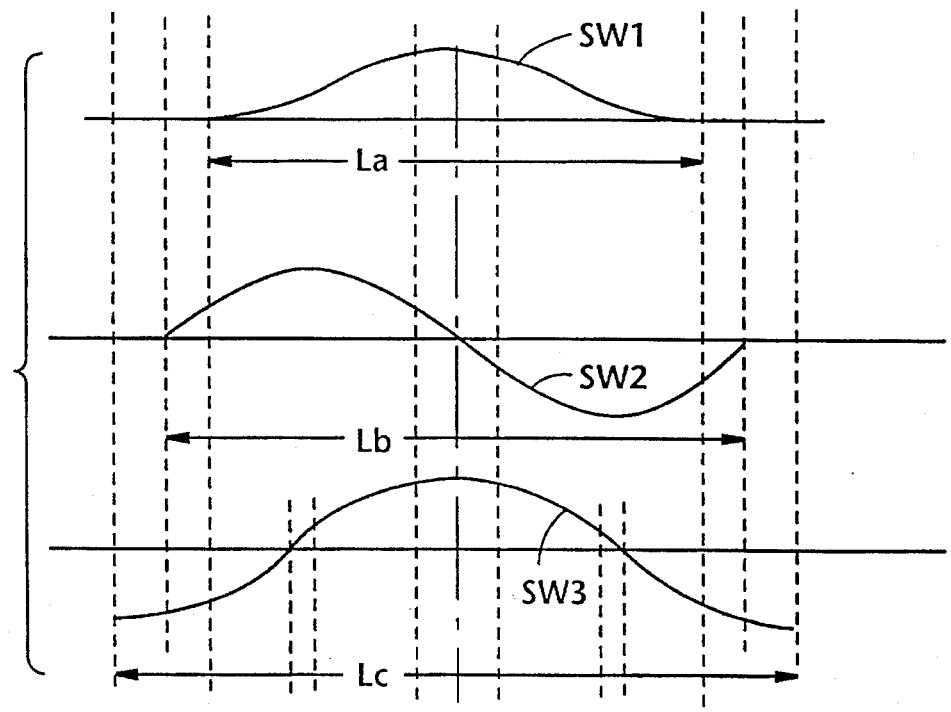
Figure 4:
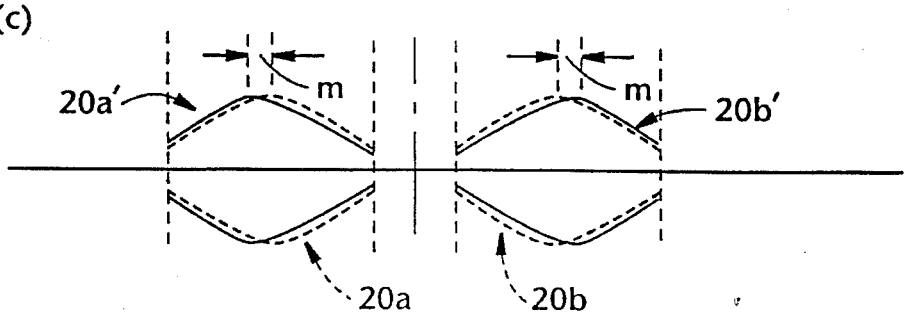

FIG. 4 shows, in part (a), a SAW resonator bandpass filter embodying the present invention. Part (b) of FIG. 4 is the same as that of FIG. 3.

As shown in part (a) of FIG. 4, each of two IDTs 12a' and 12b' is provided with a plurality of overlapped electrode portions equally spaced from each other as with the IDTs 12a and 12b (FIGS. 1 and 2). However, it should be noted that the overlapped electrode portion of each of the two IDTs 12a' and 12b' is not symmetrical with respect to the transversal center line. The reason for this is to shift outward the receive signal distribution curves 20a and 20b (FIG. 3 and FIG. 4, part (c)) by the distance "m". The shifted curves are depicted by notations 20a' and 20b'. In more specific terms, the above mentioned shifting of the curves 20a and 20b to those denoted by 20a' and 20b' is able to effectively reduce the standing wave SW3 which causes the peak P3 in that the phase of each of the curves 20a' and 20b' is different by 90 degrees with respect to that of the standing wave SW3.

As mentioned above, each of the curves 20a' and 20b' resembles the corresponding envelope of the overlapped electrode portion.

Generally speaking, if the overlapped electrode portion of each of the IDTs 12a' and 12b' is arranged such that the corresponding curve 20a' (or 20b') is shifted such as to be different in phase by 90 degrees with respect to the standing wave SW3, then the peak P3 can effectively be suppressed.

Figure 5:
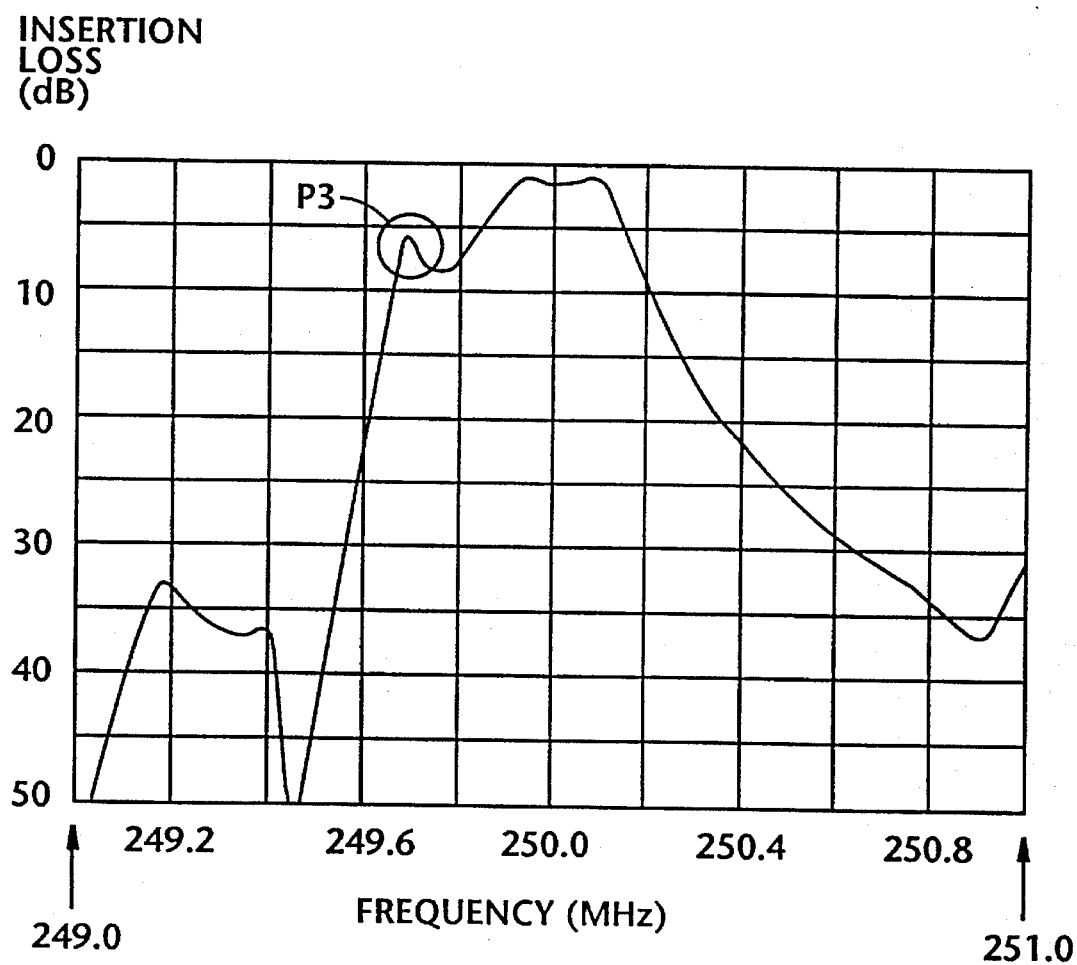
FIGS. 5 and 6 each is a graph showing the computer simulation result conducted by the inventors.
Figure 6:
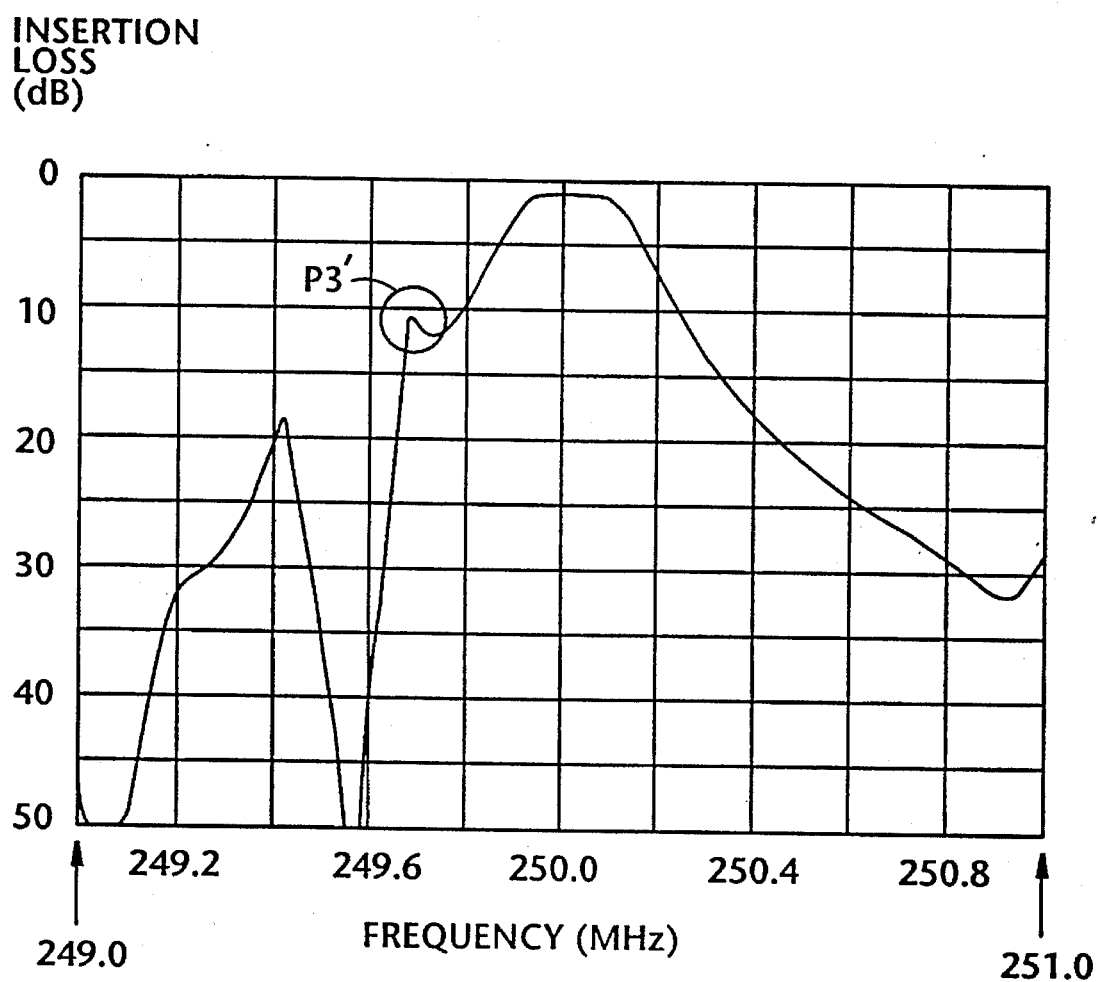

Results obtained from the computer simulation conducted by the inventors are shown in FIGS. 5 and 6.

FIG. 5 shows frequency-loss characteristics, measured from 249.0 MHz to 251.0 MHz, of the conventional bandpass filter shown in FIGS. 1 and 3 under the following conditions:

(a) D1=0.5 Å;

(b) D2=0.63 Å;

(c) The number of electrodes of each of the IDTs 12a–12b is 360; and (d) The number of electrodes of each of the reflectors 14a–14b is 100.

In the above, Å is a wave length of the center frequency of the passband.

FIG. 6 shows frequency-loss characteristics, measured from 249.0 MHz to 251.0 MHz, of the bandpass filter of the present invention (FIG. 4) under the shove mentioned conditions. However, the center of the overlapped electrode portion of each of the IDTs 12a' and 12b' is shifted outward by 12.5% of the entire longitudinal length of the element.

The above mentioned computer simulation indicates that the peak P3 shown in FIG. 5 is suppressed by about 5 dB as shown in FIG. 6.

It will be understood that the above disclosure is representative of only two possible embodiments and that various modifications can be made without departing from the concept of the invention.

What is claimed is:

1. A surface acoustic wave resonator bandpass filter which excites first, second and third distinct longitudinal resonance modes when a signal is applied to said filter, said first, second and third longitudinal resonance modes inducing respectively first, second, and third standing waves, said bandpass filter establishing bandpass characteristics using said first and second longitudinal resonance modes, said bandpass filter comprising:

first and second resonators; and first and second interdigital transducers, each of which comprises a plurality of overlapping electrodes arranged in succession along the length thereof, a respective length of each of the electrodes increasing to a maximum at a position offset from the longitudinal center of the transducer and decreasing in length in succession from said maximum to the end of said transducer, said first and second interdigital transducers being arranged to substantially prevent a spurious response from appearing at an output signal of said bandpass filter, said spurious response having a frequency lower than a passband range of frequencies of the bandpass filter.

2. A bandpass filter as claimed in claim 1, wherein said first resonator is at a first distance from said first interdigital transducer, said second resonator is at a second distance from said second interdigital transducer, and said first and second interdigital transducers are at a third distance from each other, said first and second distances are equal, and said third distance is greater than said first and second distances.

3. A bandpass filter as claimed in claim 2, wherein said first distance is 0.5 Å and said third distance is 0.63 Å, Å being a wavelength of the center frequency of the passband of said bandpass filter.

4. A surface acoustic wave resonator bandpass filter which excites first, second and third distinct longitudinal resonance modes when a signal is applied to said filter, said first, second and third longitudinal resonance modes inducing respectively first, second, and third standing waves, said bandpass filter establishing bandpass characteristics using said first and second longitudinal resonance modes, said bandpass filter comprising:

first and second resonators; and first and second interdigital transducers, each of which includes a plurality of overlapping electrodes equally spaced from each other in succession along the length thereof, a respective length of each of the electrodes increases to a maximum at a position offset from the longitudinal center of the transducer and decreases in length in succession from said maximum to the end of said transducer, said first and second interdigital transducers being arranged to substantially prevent a spurious response from appearing at an output signal of said bandpass filter, said spurious response having a frequency lower than a passband range of frequencies of the bandpass filter.

* * * * *

UNITED STATES PATENT AND TRADEMARK OFFICE
CERTIFICATE OF CORRECTION

PATENT NO. : 5,561,408
DATED : October 1, 1996
INVENTOR(S) : Yasushi YAMAMOTO, et al.

It is certified that error appears in the above-indentified patent and that said Letters Patent is hereby corrected as shown below:

Column 3, line 52, delete "Å" and insert -- $\lambda$ --.

Column 3, line 53, delete "Å" and insert -- $\lambda$ --.

Column 3, line 59, delete "Å" and insert -- $\lambda$ --.

Column 4, line 39, delete all occurrences of "Å" and insert therefor -- $\lambda$ --.

Signed and Sealed this

Thirty-first Day of December, 1996

Attest:

BRUCE LEHMAN

*Attesting Officer*     *Commissioner of Patents and Trademarks*